United States Patent [19]
Bulst

[11] Patent Number: 4,623,855
[45] Date of Patent: Nov. 18, 1986

[54] SURFACE ACOUSTIC WAVE RESONATOR FILTER HAVING RANDOMLY INTERRUPTED REFLECTOR STRIPS

[75] Inventor: Wolf-Eckhart Bulst, Vaterstetten, Fed. Rep. of Germany

[73] Assignee: Siemens Aktiengesellschaft, Berlin & Munich, Fed. Rep. of Germany

[21] Appl. No.: 600,023

[22] Filed: Apr. 13, 1984

[30] Foreign Application Priority Data

Apr. 22, 1983 [DE] Fed. Rep. of Germany ....... 3314725

[51] Int. Cl.$^4$ .............................................. H03H 9/25
[52] U.S. Cl. ..................................... 333/195; 333/153; 310/313 D
[58] Field of Search ............... 333/150, 151, 153, 193, 333/194, 195, 196; 310/313 R, 313 B, 313 C, 313 D; 29/25, 35

[56] References Cited

U.S. PATENT DOCUMENTS 3,952,269  4/1976  Bristol .................................. 333/153
4,072,915  2/1978  Mitchell .............................. 333/194
4,249,146  2/1981  Yen et al. ......................... 333/196 X
4,267,534  5/1981  Tanski ................................. 333/153
4,340,834  7/1982  Sato ................. 310/313 D

OTHER PUBLICATIONS

Electronics Letters, vol. 16, Oct. 9, 1980, pp. 793-794, "S.A.W. Device Reflectors Weighted by Combination of Withdrawn and Segmented Lines".
IEEE Transactions on Sonics and Ultrasonics, vol. SU-25, No. 3, 1978, pp. 138-146, "A Study of the Q and Modes of SAW Resonators Using Metal 'Waffle-Iron' and Strip Arrays".

Primary Examiner—Eugene R. LaRoche
Assistant Examiner—Benny T. Lee
Attorney, Agent, or Firm—Hill, Van Santen, Steadman & Simpson

[57] ABSTRACT

A surface acoustic wave resonator filter comprises reflector structures whose metallization strips are repeatedly interrupted in length, whereby the arrangement of the interruptions for the individual strips corresponds to a random distribution.

11 Claims, 3 Drawing Figures

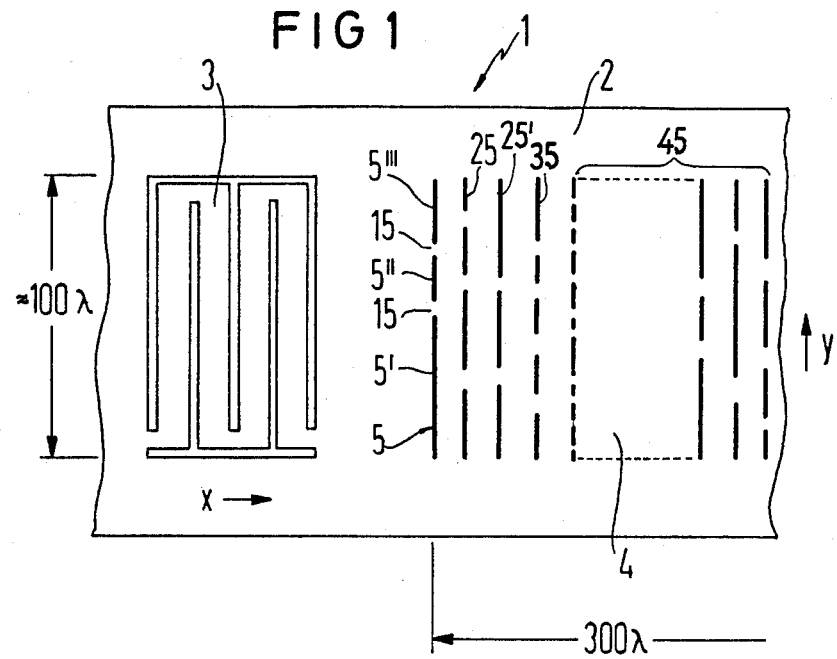
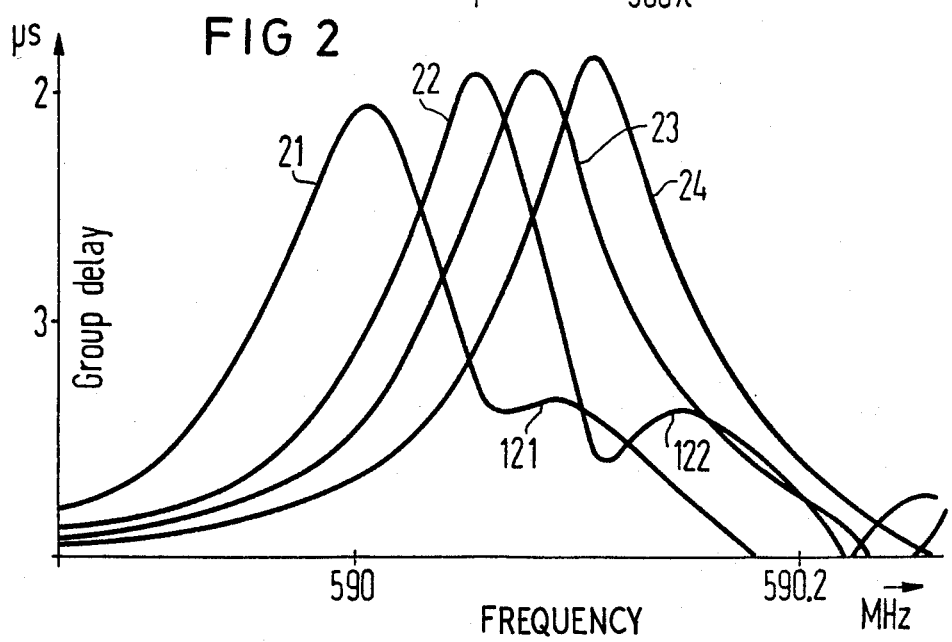

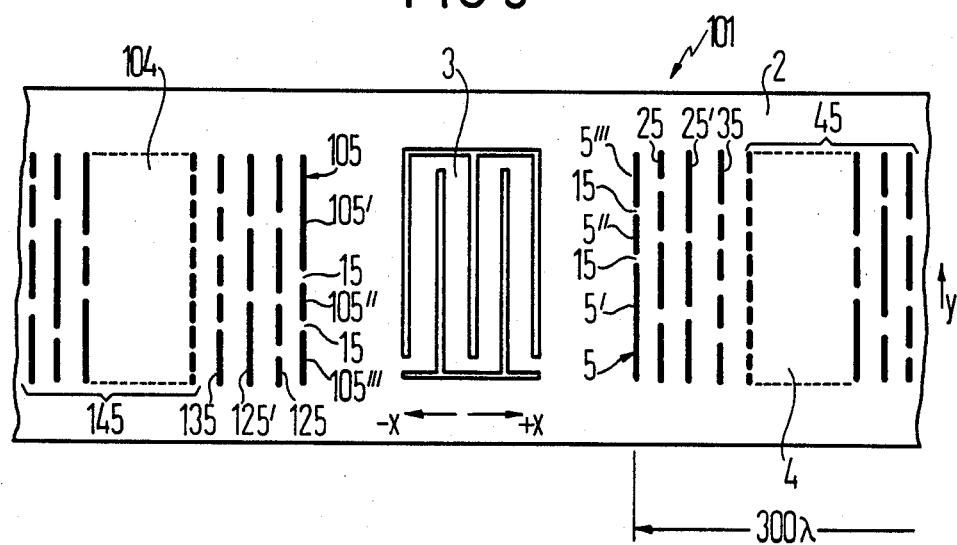

SURFACE ACOUSTIC WAVE RESONATOR FILTER HAVING RANDOMLY INTERRUPTED REFLECTOR STRIPS

BACKGROUND OF THE INVENTION

The present invention relates to a surface acoustic wave resonator filter wherein a piezoelectric substrate is provided with a reflector structure comprising metal strips on the substrate. At least one interdigital transducer is also provided on the substrate and a wave propagation occurring in the substrate in a direction perpendicular to the metallization strips.

From "IEEE Transactions on Sonics and Ultrasonics", Vol. SU-25, No. 3 (1978), pages 138-146, incorporated herein by reference, a surface acoustic wave resonator filter is known whose reflector structure, as shown in FIG. 1 therein, has, instead of continuous metallization strips, a field of metallization points in a regular waffle-iron distribution. The metallization spots succeeding thereafter in the direction transversely to the wave propagation direction replace a respective metallization strip of conventional reflector structure. The individual metallization spots have dimensions on the order of magnitude of the wave length or fractions of the wave lengths of that particular wave for which the respective reflector structure is intended. Given a strip length of e.g. 100 wave lengths, then for each individual strip, 200 interruptions result. FIG. 4 of this publication shows the result; namely, that secondary lobes of the frequency curve of a filter designed in this manner are still only poorly pronounced. This is attributed to the fact that in the direction of the individual metallization strips, no electric current flow can develop which leads to transverse modes based thereon and has as a consequence significant changes in the transit or propagation time speed of the desired propagating longitudinal wave.

An extremely frequent interruption of the customarily employed metallization strips, demanded in accordance with the above-cited publication, signifies an additional high technological design expense for the manufacture of such a filter.

It has already been investigated (U.S. Pat. No. 4,340,834, incorporated herein by reference) to what extent the result is made poorer if only four interruptions each given a number of fingers of the reflector structure are provided. These interruptions, in the case of all fingers provided for this purpose, have been localized so as to mutually correspond; i.e. all interruptions lie adjacent in one row. In this regard, see FIG. 1 and 4a of the U.S. Letters Patent. This principle of corresponding subdivisions which are precisely adjacent one another, is also present in the case of all further examples of this U.S. Letters Patent.

In contrast with arrangements of the above-discussed publication "IEEE Transactions...", in the case of the arrangements of the U.S. Pat. No. 4,340,834, the occurrence of transverse modes has again been consciously taken into account. Due to the interruptions, on account of the regularity of their arrangement directed parallel to the wave propagation of the longitudinal wave, adjacent strips with propagation speeds different from one another develop therein (see U.S. Pat. No. 4,340,834, column 5). With the occurrence of these strips, the harmful effects of the occurring transverse modes are decreased therein. However, an additional attenuation for the desired wave occurs.

According to FIG. 4B of the U.S. Pat. No. 4,340,834 the result attained therein is such that, in the curve of the attenuation progression, no side lobes of the transverse modes can be recognized any longer. On account of the logarithmic scale of the attenuation curve, however, only very considerable side lobes would be recognizable therein. However, the progression of the envelope or group delay is decisive, which, as a linear function, permits the relevance of still present side lobes to be significantly more clearly recognized, and, in the last analysis, it is this envelope delay which is of decisive significance for the signal transmission with a filter of this type.

A reflector structure designed for another purpose, namely for finger weighting, is shown in FIG. 1 in "Electronic Letters", Vol. 16 (9/10/1980), pages 793-794, incorporated herein by reference. It is provided therein, for a portion of the reflector structure, instead of providing reflector elements which are continuous over the entire width of the structure, to omit the weighting corresponding to the length components of this element provided for the respective reflector element. These omissions are distributed over the entire length of the respective reflector element so that a single weighted reflector element viewed in the direction of the individual reflector element, i.e. transversely to the wave propagation of the surface acoustic wave, consists of reflector element pieces between which (in their transverse direction) considerable distances exist. The reflector element pieces all have an equally great length and there above-mentioned distances (in a transverse direction) from one another, correspond to the prescribed weighting of the individual reflector element, are more or less large. In the case of this known reflector structure, the individual strip-shaped reflector elements and also the reflector element pieces are grooves etched into the surface of the substrate, i.e. no metallization of the surface is present in this regard. Therefore, electric currents occurring as in the case of an arrangement according to the initially described publication transversely to the wave propagation direction (i.e. such currents which lead to transverse modes) are impossible in this embodiment with grooves. Thus, the weighted reflector elements consisting in the case of this arrangement of groove-shaped reflector element pieces exhibit several interruptions but have equal-length reflector element pieces, respectively.

SUMMARY OF THE INVENTION

It is an object of the present invention to disclose a surface acoustic wave resonator filter which (at least to as great an extent as the filter of the above captioned publication "IEEE Transactions...") has a free progression of the envelope delay as a consequence of suppression of the occurrence of transverse modes of said lobes. Also said filter is to be capable of being manufactured at less cost and/or requires no new filter design.

This object is achieved with a surface acoustic wave resonator filter wherein the metallization strips of a reflector structure are interrupted such that a mathematically random distribution of said interruptions is provided in the metallization strips relative to one another and so that partial lengths resulting from the interruptions of the metallization strips are different with respect to other partial lengths of other metallization strips.

According to the invention, the extremely fine subdivision of the individual strips of the respective reflector structure are absolutely prescribed. Partial lengths with dimensions of the size of a wave length are not necessary if it is ensured in the case of less frequent interruption, or even in the case of only a small number of interruptions, that interfering transverse modes nevertheless cannot occur. It has been confirmed by practical experiments that it is beneficial according to the invention to distribute the interruptions (only a few of which are provided in accordance with the invention) of the respective individual metallization strips. The resulting partial lengths of the metallization strips vary from strip to strip in such a fashion that altogether for the entire structure, a completely unordered distribution of the interruptions is provided, i.e. a mathematical random distribution is present. Thus, corresponding to random probability, a strip can indeed have the same subdivision as its adjacent strip. However, considering all metallization strips, no particular order of the respective subdivision of the individual metallization strips can be observed. From respectively unordered subdivisions of the individual strips, it then inevitably results that the respective strip of the individual strips consists of partial lengths dimensioned in a randomly distributed fashion corresponding to the number of respective interruptions of the respective strip.

The random distribution to be employed in accordance with the invention can be specified in correspondence with an output of a random number generator. Thus, for the individual metallization strips, a respectively equal number of interruptions randomly distributed over its length are provided such as two, five, or ten interruptions for the individual metallization strip. According to the invention, however, the number of interruptions of a respective metallization strip may be left to chance. For example, a random distribution may be provided such as at least two interruptions and with a maximum of ten interruptions.

As a rule ten interruptions for a respective metallization strip of such a reflector structure are entirely sufficient in order to obtain very substantial suppression and is usually sufficient for suppression of the otherwise occurring side lobes. For the problem to be solved, the gaps resulting from such interruptions are short, as is necessary for an electrical suppression (separation) in accordance with the object of the invention. It is of particular advantage to apply the invention in the case of a substrate of quartz lithium tautalate, or lithium niobate. Quartz is preferably employed for surface acoustic wave resonator filters.

With the invention, the manufacturing method of conventional reflector structures is at least not made substantially more difficult. To produce individual interruptions of a metallization strip is customary practice for finger-weighted interdigital structures. In the case of the invention, however, there is the additional facilitating feature that the precision of the position of a respective interruption within a respective metallization strip, and hence also the resulting partial pieces of the strip, is virtually insignificant, since their position is "random" anyway. A further significant advantage of the invention is that in the case of a small number of interruptions of the individual metallization strips, the wave propagation speed does not significantly change for the entire resonator filter. This is compared with the filter with a reflector structure without any interruptions. A resonator filter according to the invention therefore requires no new design or no new filter design because the few interruptions of each strip weighted in this fashion have no aggravating influence on the propagation speed of the wave. For a filter according to the above initially cited publication, by contrast a substantially different frequency band spread of the resonance results in comparison with the filter without such a waffle-iron structure of the reflector. Thus, in the framework of the invention, the respective structure with metallization strips without interruptions is manufactured first and only then are the interruptions, distributed in accordance with the invention in mathematical random sequence, applied.

BRIEF DESCRIPTION OF THE DRAWINGS

FIG. 1 shows a resonator filter according to the invention; and

FIG. 2 shows the result of certain frequency responses of resonator filters according to the invention; and FIG. 3 shows a reflector structure of the type shown in FIG. 1 but wherein such a reflector structure is provided on each side of an input/output transducer.

DESCRIPTION OF THE PREFERRED EMBODIMENTS

FIG. 1 shows a resonator filter 1 according to the invention which is disposed on a substrate 2 of quartz. Reference numeral 3 designates an interdigital structure of a conventional type which is employed as an input and/or output transducer. Of the resonator filter 1 related to the wave propagation direction x, only a section is illustrated, namely only a single reflector structure 4 with an associated reflector structure similar on the side of the transducer 3 which is oppositely disposed in the x-direction. Reference numeral 5 designates a typical individual metallization strip of the reflector structure. The outside ends of the respective outside strips of the structure 4 may be electrically shorted by two respective bus bars, as is known. For clarity, only a small number of strips 5, 25, 25', 35, 45 is illustrated. In the case of a reflector structure designed according to the invention, at least a plurality and preferably all metallization strips are provided with such randomly distributed interruptions.

The reflector structure 4 of the illustration of FIG. 1 has a left-side first metallization strip 5 which possesses two interruptions or gaps 15 so that this metallization strip 5 breaks into three partial lengths 5', 5'', 5''' with a respectively small length of the interruptions 15. The following metallization strip 25 to the right in this example has three interruptions, the next metallization strip 25' has two interruptions, and the next metallization strip 35 by contrast has four interruptions, i.e. five partial lengths. This illustration is also intended to explain the principle of having a randomly different number of interruptions of the individual metallization strips 5, 25, 25', 35, and remaining strips 45.

Entirely within the framework of having a random distribution of interruptions, the two metallization strips separately designated with 25, 25' as illustrated, can have interruptions which are positioned adjacent or in line with one another in the wave propagation direction (see lower two interruptions in each strip 25, 25' in FIG. 1). This does not contradict the principle of chance. However, within the overall reflector structure in accordance with random probability, this occurs only extremely rarely.

FIG. 2 shows four frequency curves for the envelope delay. They essentially correspond to FIG. 4 of the above cited publication. The frequency curve referenced 21 was measured on a surface acoustic wave resonator filter which had reflector structures without interruptions of the metallization strips. The curve 22 by contrast was measured on a resonator filter in which all metallization strips of the reflector structures each have only one single interruption, these single interruptions being distributed according to chance. In the two curves 21 and 22, side lobes 121 and 122 can be recognized. It is pointed out that these lobe heights which occur during impedance watched operation are very much higher and can also readily reach the height of the desired maximum of the filter curve.

The filter curve 23 of a resonator filter with two interruptions in every metallization strip of the reflector structures is shown in FIG. 2. The curve 24 was measured on a filter with reflector structures whose metallization strips have three interruptions each. In accordance with the invention, these two-time or three-time interruptions within the individual metallization strips are distributed in a mathematically random fashion over the respective entire reflector structure; i.e., there is not only a random distribution for the partial lengths 5', 5", 5'" . . . within a typical individual strip 5, but also a random distribution for all strips 5, 25, 25', 35, and 45 when comparing the number of interruptions and partial lengths in one strip to the number of interruptions and partial lengths in the other strips.

FIG. 2 clearly illustrates the surprising results; namely, that two interruptions per strip provide a virtually completely satisfactory result. It is apparent therefrom that the manufacture expense of an inventive resonator filter, i.e. a resonator filter in which already complete elimination of the side lobes has been achieved, can be realized without significant additional expense. Such a filter requires, in particular, no fine subdivision of the metallization strips as are prescribed corresponding to the above-cited publication.

It can already be sufficient for several reflector structures (for example, as show in FIG. 3 in the case of two reflector structures 4 and 104 (with corresponding elements 15, 105, 105', 105", 105'", 125, 125', 135, and 145) between which the input and output transducer 3 is disposed) to provide some or only one reflector structure with the dimensions or distributed multiple interruptions of the metallization strips according to the invention.

Although various minor changes and modifications might be suggested by those skilled in the art, it will be understood that I wish to include within the claims of the patent warranted hereon all such changes and modifications as reasonably come within my contribution to the art.

I claim as my invention:

1. A surface acoustic wave resonator filter, comprising: a substrate of piezoelectric material; a reflector structure comprising parallel metallization strips on the substrate; at least one interdigital transducer on the substrate, and in the substrate a wave propagation occurring between the transducer and the reflector structure in a direction perpendicular to the metallization strips; at least a plurality of the metallization strips being interrupted along a transverse direction to said wave propagation direction so as to create partial length strips spaced by gaps which are relatively short compared to a length of said partial length strips, the gaps being sufficient for electrical separation between adjacent partial length strips of a given strip; for at least a plurality of metallization strips of the reflector structure, a mathematically random distribution of a location of the interruptions is provided such that said partial length strips resulting from the interruptions of each of the metallization strips are randomly different with respect to the partial length strips of the other metallization strips corresponding to said random distribution.

2. A surface acoustic wave resonator filter according to claim 1 wherein the piezoelectric material of the substrate is quartz.

3. A surface acoustic wave resonator filter according to claim 1 wherein at least two interruptions of each metallization strip are present.

4. A surface acoustic wave resonator filter according to claim 1 wherein a maximum of ten interruptions are provided in the metallization strips.

5. A surface acoustic wave resonator filter according to claim 1 wherein an overall length of the respective metallization strips in said transverse direction amounts to 50-200 wave lengths wherein the wave length is a design wave length to be passed by the filter.

6. A surface acoustic wave resonator filter according to claim 1 wherein locations of interruptions within an individual metallization strip compared with locations of interruptions of remaining metallization strips corresponds to a random sequence.

7. A surface acoustic wave resonator filter according to claim 1 wherein all metallization strips of the reflector structure each have a same number of interruptions.

8. A surface acoustic wave resonator filter according to claim 1 wherein a number of interruptions for each of the individual metallization strips relative to a number of interruptions in each of all of the other metallization strips corresponds to a random distribution.

9. A surface acoustic wave resonator filter according to claim 1 wherein at least two reflector structures are provided, each having metallization strips with interruptions resulting in partial lengths which are different with respect to one another in accordance with a random distribution.

10. A surface acoustic wave resonator filter, comprising:
a substrate of piezoelectric material;
a reflector structure comprising parallel metallization strips on the substrate;
at least one interdigital transducer on the substrate, and in the substrate a wave propagation occurring between the transducer and the reflector structure in a direction perpendicular to the metallization strips;
at least a plurality of said metallization strips of the reflector structure having arranged in a direction of said strips transverse to the propagation direction a plurality of partial length strips formed by interruptions which are short relative to a length of said partial length strips sufficient to disrupt electrical current flow;
locations of said interruptions having a mathematically random distribution so that partial length strips resulting from the interruptions in a metallization strip are different with respect to partial length strips relative to the other interrupted metallization strips corresponding to the random distribution; and each of said interrupted strips having an equal number of interruptions, said number being between 2 and 10.

11. A surface acoustic wave resonator filter, comprising:
a substrate of piezoelectric material;
a reflector structure comprising parallel metallization strips on the substrate;
at least one interdigital transducer on the substrate, and in the substrate a wave propagation occurring between the transducer and the reflector structure in a direction perpendicular to the metallization strips;
at least a plurality of said metallization strips of the reflector structure having arranged in a direction of said strips transverse to the propagation direction a plurality of partial length strips formed by interruptions which are short relative to a length of said partial length strips sufficient to disrupt electrical current flow;
locations of said interruptions having a mathematically random distribution so that partial length strips resulting from the interruptions in a metallization strip are different with respect to partial strips relative to the other interrupted metallization strips corresponding to the random distribution; and
each interrupted strip having a random number of interruptions between 2 and 10.

* * * * *